United States Patent
Meisel

(10) Patent No.: US 8,673,793 B2
(45) Date of Patent: Mar. 18, 2014

(54) METHOD FOR AUTOMATIC OFFSET CALCULATION FOR DEPOSITION OF AN ALIGNED METAL PATTERN ONTO SELECTIVE EMITTER PATTERN AND SUBSEQUENT MONITORING OF ALIGNMENT

(75) Inventor: Andreas Meisel, Mountain View, CA (US)

(73) Assignee: Innovalight Inc

( * ) Notice: Subject to any disclaimer, the term of this patent is extended or adjusted under 35 U.S.C. 154(b) by 0 days.

(21) Appl. No.: 13/358,131

(22) Filed: Jan. 25, 2012

(65) Prior Publication Data

US 2013/0040421 A1    Feb. 14, 2013

Related U.S. Application Data

(60) Provisional application No. 61/435,928, filed on Jan. 25, 2011.

(51) Int. Cl.
*H01L 21/31* (2006.01)
*H01L 21/469* (2006.01)

(52) U.S. Cl.
USPC ............. 438/781; 438/16; 438/73; 257/437; 257/E21.53; 257/E21.242

(58) Field of Classification Search
USPC ............. 438/781, 16, 73; 257/437, E21.53, 257/E21.242
See application file for complete search history.

(56) References Cited

U.S. PATENT DOCUMENTS

| | | | |
|---|---|---|---|
| 8,048,814 B2* | 11/2011 | Meisel et al. | 438/781 |
| 8,288,176 B2* | 10/2012 | Meisel et al. | 438/16 |
| 2010/0136718 A1* | 6/2010 | Meisel et al. | 438/16 |
| 2011/0003465 A1 | 1/2011 | Scardera et al. | |
| 2011/0183504 A1 | 7/2011 | Scardera et al. | |
| 2012/0048132 A1* | 3/2012 | Baccini et al. | 101/118 |
| 2012/0083054 A1* | 4/2012 | Meisel et al. | 438/16 |

FOREIGN PATENT DOCUMENTS

| | | |
|---|---|---|
| EP | 0 906 827 A1 | 4/1999 |
| EP | 2 216 175 A1 | 8/2010 |
| WO | 2010/094344 A1 | 8/2010 |

OTHER PUBLICATIONS

U.S. Appl. No. 13/099,794, filed May 3, 2011, Kelman et al.
U.S. Appl. No. 13/172,040, filed Jun. 29, 2011, Scardera et al.
U.S. Appl. No. 61/577,901, filed Dec. 20, 2011, Abbott et al.

(Continued)

*Primary Examiner* — Telly Green

(57) ABSTRACT

A method for calculating an offset value for aligned deposition of a second pattern onto a first pattern, comprising steps of: (a) loading a substrate with the first pattern on a surface of the substrate into a pattern recognition device at an original position inside the pattern recognition device; (b) determining a coordinate of a prescribed point of the first pattern by the pattern recognition device; (c) superimposing the second pattern onto the first pattern on the surface of the substrate; (d) bringing back the substrate with the first pattern and the second pattern into the original position inside the pattern recognition device; (e) determining a coordinate of a prescribed point of the second pattern by the pattern recognition device; wherein the prescribed point of the first pattern corresponds to the prescribed point of the second pattern; and (f) calculating the offset value between the first pattern and the second pattern.

11 Claims, 9 Drawing Sheets

(56) References Cited

OTHER PUBLICATIONS

Dauwe, et al., Experimental Evidence of Parasitic Shunting in Silicon Nitride Rear Surface Passivated Solar Cells, Progress in Photovoltaics: Research and Applications, Prog. Photovolt: Res. Appl. 2002; vol. 10; pp. 271-278.

Heath, A Liquid-Solution-Phase of Crystalline Silicon, Science, vol. 258, Nov. 13, 1992, pp. 1131.

Honsberg, et al., 685 mV Open-Circuit Voltage Laser Grooved Silicon Solar Cell, Solar Energy Materials and Solar Cells, vol. 34 (1994), pp. 117-123.

Iijima, Fine Particles of Silicon. I. Crystal Growth of Spherical Particles of Si, Japanese Journal of Applied Physics, vol. 26, No. 3, Mar. 1987, pp. 357-364.

Jasinski et al., Photochemical Preparation of Crystalline Silicon Nanoclusters, Chem. Mater. 1991, vol. 3, pp. 989-992.

Littau, et al., A Luminescent Silicon Nanocrystal Colloid via a High-Temperature Aerosol Reaction, J. Phys. Chem. 1993, vol. 97, pp. 1224-1230.

Petrovakoch, et al., Rapidthermaloxidized porous Si—The superior photoluminescent Si, Applied Physics Letters, vol. 61, (1992), pp. 943-945.

Poplavskyy, et al., Silicon Ink Selective Emitter Process: Optimization of the Short Wavelength Response, $25^{th}$ European Photovoltaic Solar Energy Conference and Exhibition, Sep. 6-10, 2010, Valencia, Spain.

Takagi, et al., Quantum Size Effects on Photoluminescence in Ultrafine Si Particles, Applied Physics Letters, vol. 56, (1990), pp. 2379-2380.

\* cited by examiner

Detection of unique feature/point 1 in selective emitter pattern

Determined coordinates of unique point in selective emitter pattern: $x_1/y_1$ $(x_1/y_1)$ Detection of unique feature/point 2 in selective emitter pattern Determined coordinates of unique point in selective emitter pattern: $x_2/y_2$ $(x_2/y_2)$

METHOD FOR AUTOMATIC OFFSET CALCULATION FOR DEPOSITION OF AN ALIGNED METAL PATTERN ONTO SELECTIVE EMITTER PATTERN AND SUBSEQUENT MONITORING OF ALIGNMENT

CROSS-REFERENCE TO RELATED APPLICATION

This application claims the benefit of U.S. Provisional Application No. 61/435,928, filed Jan. 25, 2011.

FIELD OF THE INVENTION

This disclosure relates in general to Group IV semiconductors and in particular to methods and apparatus for aligning a set of patterns on a silicon substrate.

TECHNICAL BACKGROUND OF THE INVENTION

Semiconductors form the basis of modern electronics. Possessing physical properties that can be selectively modified and controlled between conduction and insulation, semiconductors are essential in most modern electrical devices (e.g., computers, cellular phones, photovoltaic cells, etc.). Group IV semiconductors generally refer to those first four elements in the fourth column of the periodic table: carbon, silicon, germanium and tin.

The ability to deposit semiconductor materials using non-traditional semiconductor technologies such as printing may offer a way to simplify the fabrication process and hence reduce the cost of many modern electrical devices (e.g., computers, cellular phones, photovoltaic cells, etc.). Like pigment in paint, these semiconductor materials are generally formed as microscopic particles, such as nanoparticles, and temporarily suspended in a colloidal dispersion that may be later deposited on a substrate.

Nanoparticles are generally particles with at least one dimension less than 100 nm. In comparison to a bulk material (>100 nm) which tends to have constant physical properties regardless of its size (e.g., melting temperature, boiling temperature, density, conductivity, etc.), nanoparticles may have physical properties that are size dependent, such as a lower sintering temperature.

The nanoparticles may be produced by a variety of techniques such as evaporation (S. Anima, Jap. J Appl. Phys. 26, 357 (1987)), gas phase pyrolysis (K. A Littau, P. J. Szajowski, A. J. Muller, A. R. Kortan, L. E. Brus, J Phys. Chem. 97, 1224 (1993)), gas phase photolysis (J. M. Jasinski and F. K. LeGoues, Chem. Mater. 3, 989 (1991);), electrochemical etching (V. Petrova-Koch et al., Appl. Phys. Lett. 61, 943 (1992)), plasma decomposition of silanes and polysilanes (H. Takagi et al, Appl. Phys. Lett. 56, 2379 (1990)), high pressure liquid phase reduction-oxidation reaction (J. R. Heath, Science 258, 1131 (1992)), etc.

One application of Group IV semiconductor nanoparticle materials is a dual-doped or selective emitter (SE) photovoltaic cell. A selective emitter structure is a front-contact solar cell and provides an efficiency improvement over a standard homogeneous emitter photovoltaic cell. Surface regions under the metal front contacts are heavily doped to improve ohmic contact, while remaining emitter surface regions are lightly doped to minimize charge carrier recombination, thus increasing short-circuit current and open circuit voltage and thereby output efficiency.

Selective emitters are commonly formed with either multiple diffusion steps in conjunction with diffusion blocking layers, or with the use of multiple dopant sources. Commonly, the principal variation between such regions is a difference in dopant atomic concentration, and there is generally low or no visible contrast between the highly and lightly doped regions. Consequently, the alignment of a metal contact pattern onto a previously deposited highly doped region pattern can be a large technical challenge. For example, the general lack of a visible contrast makes it difficult to monitor the accuracy of metal contact pattern placement or to detect potential axial and/or angular misalignment.

Likewise, in a back-contact solar cell, a set of counter-doped inter-digitated highly doped patterns with superimposed metal contacts are configured on the back side of the solar cell. In addition, the back surface may also be lightly doped with one of the dopants used in the inter-digitated highly doped patterns to form a BSF (back surface field). As with selective emitters, the visual boundaries between highly doped and lightly doped regions are difficult to determine. Consequently, metal contact pattern alignment for this cell structure is also problematic.

Common alignment methods are wafer edge alignment or alignment to fiducial marks. Fiducial marks (or fiducials) allow a pattern deposition device, usually a screen printer or inkjet printer, to deposit the desired pattern relative to specific coordinates on the solar cell. These fiducial marks are placed in an independent step before patterning, thus requiring extra tools and processing steps. Importantly, tolerance errors at each fiducial alignment step are additive. That is, first the selective emitter pattern is defined relative to the fiducials within a certain tolerance followed by the metal deposition also positioned relative to the fiducials with a different tolerance. To ensure alignment of the metal contacts to the selective emitter these tolerances are added and either the selective emitter pattern is designed larger than the metal pattern to ensure no metal touches the lower doped regions or a degree of misalignment is tolerated. In each case a sacrifice in device efficiency potential is accepted due to higher contact resistance when metal is contacting a lower doped region or due to lower current when the selective emitter pattern is designed with large features to ensure metal only contacts highly doped regions. Tighter alignment tolerances enable higher efficiencies.

For edge alignment, if different deposition tools are used for subsequent layers, the alignment accuracy of the second pattern is reduced since the placement errors of each deposition step are additive. Also, the vision systems of both deposition tools generally need to use similar pattern recognition methods and alignment algorithms in order to avoid additional alignment errors. Last, edge alignment requires that the wafer orientation be kept constant (to minimize errors caused by variations in wafer sizes) between subsequent deposition steps, which may restrict and complicate wafer handling.

In view of the foregoing, there is a desire to provide methods of aligning a set of patterns.

SUMMARY OF THE INVENTION

For the positioning of a first pattern with respect to a second pattern, such as the metal grid and the SE pattern, it is advantageous if the alignment can be done using the underlying pattern itself as a reference, since in this case the placement error of the first pattern can be neglected. Furthermore, a potentially incorrect wafer orientation will be detected in the case of pattern alignment, while this is not the case for other alignment methods such as edge alignment.

The invention relates, in one embodiment, to a method for calculating an offset value for aligned deposition of a second pattern onto a first pattern, comprising steps of: (a) loading a substrate with the first pattern on a surface of the substrate into a pattern recognition device at an original position inside the pattern recognition device; (b) determining a coordinate of a prescribed point of the first pattern by the pattern recognition device; (c) superimposing the second pattern onto the first pattern on the surface of the substrate; (d) bringing back the substrate with the first pattern and the second pattern into the original position inside the pattern recognition device; (e) determining a coordinate of a prescribed point of the second pattern by the pattern recognition device; wherein the prescribed point of the first pattern corresponds to the prescribed point of the second pattern; and (f) calculating the offset value between the first pattern and the second pattern.

The invention relates, in another embodiment, to a method for producing a superimposed pattern, comprising steps of: loading a substrate with a first pattern on a surface of the substrate into a deposition device of a second pattern; and superimposing the second pattern onto the first pattern on the surface of the substrate based on the offset value calculated by the above method for calculating an offset value for aligned deposition of a second pattern onto a first pattern.

BRIEF DESCRIPTION OF THE DRAWINGS

The present invention is illustrated by way of example, and not by way of limitation, in the figures of the accompanying drawings.

DETAILED DESCRIPTION OF THE INVENTION

Figure 1:
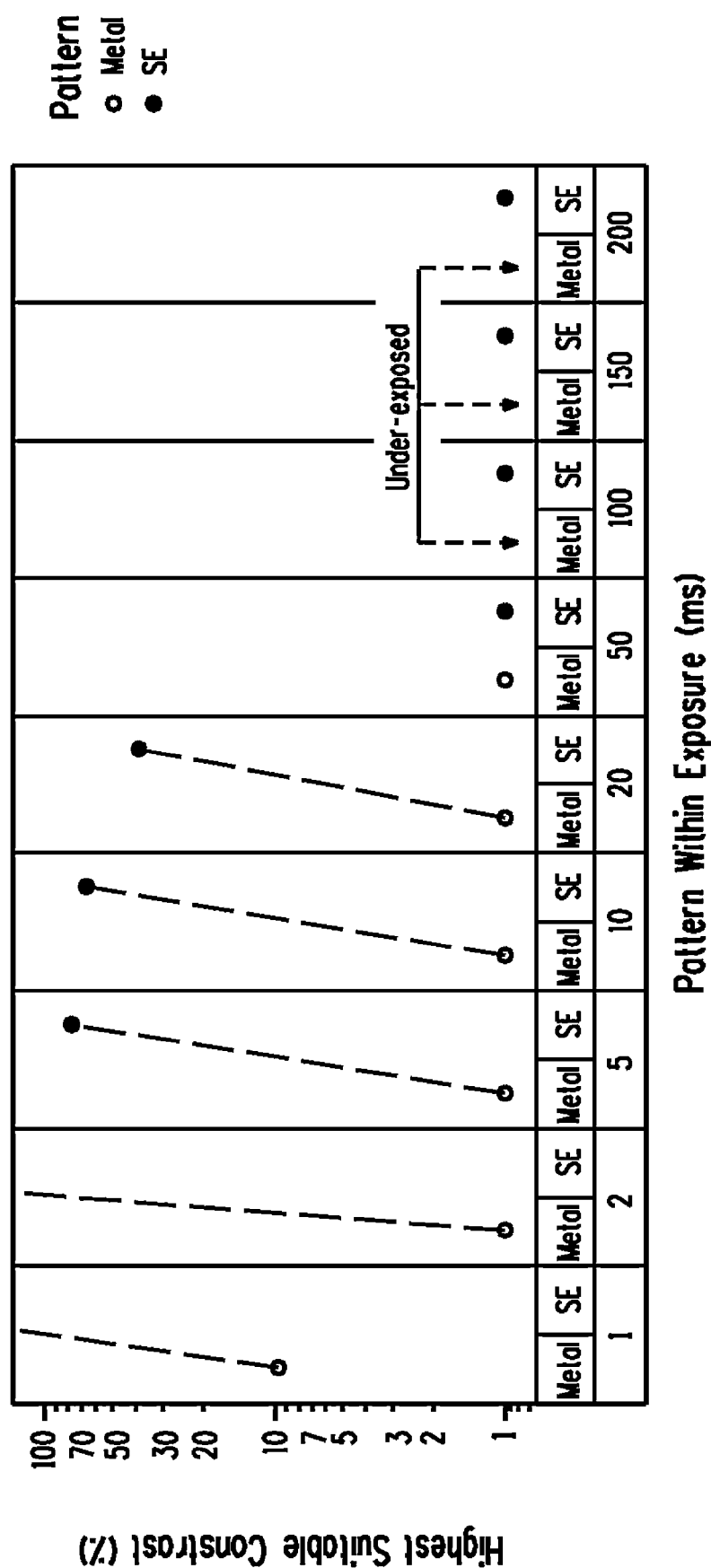
FIG. 1 shows lowest contrast ratio that is suitable to illuminate two patterns with different optical properties, such as a selective emitter (SE) pattern (filled circles) and a metal pattern (open circles) at a given exposure time.

The present invention will now be described in detail with reference to a few embodiments thereof as illustrated in the accompanying drawings. Most of the following description is directed to photovoltaic cell with selective emitters. However, the scope of the present invention is not limited to the described embodiments. Instead, the invention can be applied to any two patterns with distinct optical properties (such as for example reflection properties), which are to be deposited such that they are aligned with respect to each other. Both patterns can, but do not have to, be of identical shape and size. One example is aligning a front metal electrode on the front surface with respect to a selectively doped front diffusion layer of selected polarity and forming ohmic contact to the front diffusion layer through the front anti-reflective layer. Another example is aligning a rear metal electrode on the rear surface with respect to a selectively doped rear diffusion layer of selected polarity and forming ohmic contact to the rear diffusion area through the rear passivation layer.

In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Most solar cells are generally formed on a silicon substrate doped with a first dopant (commonly boron) forming an absorber region, upon which a second counter dopant (commonly phosphorous) is diffused forming the emitter region, in order to complete the p-n junction. The emitter region can either be a homogeneous region or divided into areas of different doping strength, such as in a selective emitter solar cell. After the addition of passivation, back surface field (BSF), and antireflection coatings, metal electrodes (fingers and busbar on the emitter and pads on the back of the absorber) may be added in order to extract generated charge.

In some cases, the commonly used continuous aluminum BSF may be replaced with a more reflective and better passivating layer, effectively reducing the rear metal contact area. This tends to reduce charge carrier recombination at the back surface and to increase the absorption of long wavelength light, leading to improved output performance.

In general, an anti-reflective coating, such as silicon nitride, is deposited in solar cells in order to maximize the light absorption and minimize reflection (maximize light available to be converted to electrical energy). Creating interference and thus canceling two out-of-phase reflected waves, the thickness of the anti-reflective coating is generally optimized for a particular wavelength and a particular surface reflectivity. In addition, the surface of the silicon substrate may be treated to minimize reflection. Any "roughening" of the surface reduces reflection by increasing the chances of reflected light bouncing back onto the surface, rather than out to the surrounding air.

By measuring a ratio of reflectance within a specific wavelength region between a first highly doped region formed by the deposition of an organic silicon ink and a second lightly doped diffused region, a subsequent pattern, such as a set of metal contacts, may be deposited in a manner optimized for each individual solar cell substrate. More specifically, a gray scale image may be generated with digital imaging of portions of the solar cell substrate surface with both highly doped and lightly doped areas. This gray value image may then be segmented into common regions which have substantially similar dopant strength. Similarly, the process can be applied to substrates with selective doping in Passive Emitter Rear Cell or similar architectures with local backsurface field, or to patterns that differ in properties other than dopant strength but can be optically distinguished (e.g. masking layers).

For many types of high efficiency solar cells (for example but not excluding, selective emitter solar cells), a metal front grid electrode pattern needs to be deposited such that it is aligned with respect to the underlying highly doped region of the selective emitter pattern. Pattern recognition software is used by the metal front grid deposition system to detect unique features in the selective emitter pattern of all incoming wafers. Appropriate coordinate transformations are applied to align the metal print pattern on top of the selective emitter pattern.

The problem is that at the beginning of a print session, an initial set of offset values needs to be determined, which depends on the respective position of wafer, screen, and selective emitter pattern on the wafers to each other. After pattern recognition, the accurate position of the selective emitter pattern is known; however, at this point the correlation is still missing between the position of this pattern and the metal pattern, which is to be printed.

This can be done manually in a time-consuming and cumbersome process by first printing a metal pattern at an arbitrary position with respect to the selective emitter pattern. Then, offsets between metal and selective emitter pattern are determined using e.g. a microscope. For this, one constraint is that there must be sufficient contrast between the two patterns, so they can be distinguished from each other. Finally, parameters for a coordinate transformation need to be calculated and applied for consecutive prints. Iteratively, the offset between the two patterns is minimized by repeating this process on multiple wafers.

We propose a method that allows determining offset values, required for an aligned deposition of two layers, by means of consecutive pattern recognition of unique points in the two patterns, which have different optical properties (such as reflection properties). This method can be applied under production environment conditions, and for process monitoring, it can be repeated in arbitrary time intervals.

In detail, the conventional and manual process may for example be done in the following way: First, a wafer with selective emitter pattern is loaded into the field of view area of the vision system. Then, unique pre-determined features of the selective emitter pattern are recognized by means of pattern recognition. Afterwards, the metal pattern is printed on top of the first layer, but at this point at an arbitrary location, using a best guess of offset values. Now, the wafer is unloaded and inspected with a stand-alone inspection tool, such as an optical microscope or an automated vision tool with calibrated measurement function. The offsets between metal and selective emitter regions needs to be determined by identifying protruding areas of the underlying layer and measuring their shift in position with respect to the top layer. The parameters of the translation/rotation, which enables the accurate alignment of metal and selective emitter patterns for consecutive prints, are calculated and entered into the software of the metal deposition tool. The entire process is repeated on a second wafer and iteratively, on more wafers, to fine tune the alignment of the two printed layers.

It can be difficult to accurately measure the offset between metal and selective emitter pattern. Once the metal pattern is deposited on top of the underlying pattern, the latter is covered and therefore, only protruding areas can be detected. Furthermore, these protruding areas can be hard to visualize against the dominating signal of the top layer. It requires a calibrated microscope with accurate measurement function, good contrast between metal and selective emitter pattern and adequate illumination conditions to enable/enhance this contrast. Also, a skilled operator is required, and the determination of offsets by manual microscope measurements can be subjective and vary between operators. All of the above can be difficult to be realized under production conditions. Also, for process monitoring, this process has to be manually repeated.

In an advantageous manner, we propose to perform the offset determination and calculation using the pattern recognition capabilities of the metal deposition machine, without the need for an external detection tool and manual measurements. Instead of measuring the offset between two patterns after the deposition of the second pattern, which is difficult according to the description above, the relative position of the two patterns with respect to each other is determined in two separate steps. Therefore, the measurement is significantly less sensitive and more robust.

The position of the first layer is determined under illumination conditions optimized for this first layer, without any masking by a top layer. The position of the second layer is determined under illumination conditions optimized for the second layer.

Unlike in the conventional process described above, the illumination does not need to visualize both layers at the same time, which can be difficult to achieve and may lead to artifacts, like e.g. blurring of features due to over-exposure. Furthermore, additional features, such as fiducial marks, can be used in one or both of the patterns to enhance the stability of the pattern recognition process. The two patterns do not have to be of the same size or exact same shape. This method is applicable for any two patterns that are to be aligned with respect to each other, resulting in a geometry of desired nature. One example is aligning a front metal electrode on the front surface with respect to a selectively doped front diffusion layer of selected polarity and forming ohmic contact to the front diffusion layer through the front anti-reflective layer. Another example is aligning a rear metal electrode on the rear surface with respect to a selectively doped rear diffusion layer of selected polarity and forming ohmic contact to the rear diffusion area through the rear passivation layer.

The first aspect to be noted is that the two patterns have distinct optical properties (such as reflection properties) in an embodiment, which allow the detection of the second layer by the vision system under selected illumination conditions, without intereference of the first layer.

The second aspect to be noted is the definition of multiple, unique sets of points within the two patterns. Ideally, these unique sets of points are defined such that they perfectly overlay if and only if, the two patterns are perfectly well aligned in an embodiment. In any other case of misalignment between the two layers, there would be an offset between these sets of unique points. Alternatively, the sets of unique points can be defined such that in a perfectly well aligned pattern, the offset of these points in the two patterns corresponds to a known value, different from zero.

By means of pattern recognition software, the coordinates of these sets of unique points in the two patterns can be identified in two measurement steps and then be used to calculate transformation parameters to allow for successful alignment of the two patterns.

The third aspect to be noted to this process is to ensure that for the measurement, which follows the deposition of the 2nd layer, the wafer is brought back into the same position relative to the inspection tool that it was in for the measurement of the first layer. This boundary condition depends on the mechanical accuracy of the wafer positioning system within the metal deposition tool, which is known to be very high for standard production tools.

In detail, this process may for example be done in the following embodiments.

In an embodiment, an illumination for determining the prescribed point of the first pattern has different illumination intensity or illumination spectrum to achieve optimum ratio of reflectance (as explained above) from the respective conditions to achieve optimum ratio of reflectance for determining the prescribed point of the second pattern. A typical way to adjust illumination conditions is to vary contrast level and/or exposure time in the software controlling the cameras of the pattern recognition system of the pattern deposition machines. Also, the illumination spectrum can be varied to alter the resulting reflectance ratio.

For example, in a selective emitter solar cell, ratios of reflectance of highly doped regions to lightly doped regions on a textured silicon nitride coated crystalline silicon substrate can be as large as 50 and as low as values of ~1.5-1.4, but values of 1.3 or lower are avoided in an embodiment.

In one configuration of a selective emitter solar cell, an optimum ratio of reflectance for the selective emitter pattern against the lightly doped background is achieved for an incident illumination spectrum between 375 nm and 600 nm and contrast levels between 40 and 90% at a selected exposure time of 20 ms. (Typical exposure times vary between 1 and 200 ms.)

On the other hand, due to the increased reflection properties of the metal pattern the values to achieve optimum ratio of reflectance for the metal pattern are significantly lower. At the same selected exposure time of 20 ms, the contrast levels can be between 1 and 2% in an embodiment, whereas higher values result in over-exposed images and inaccurate pattern alignment.

Figure 2:
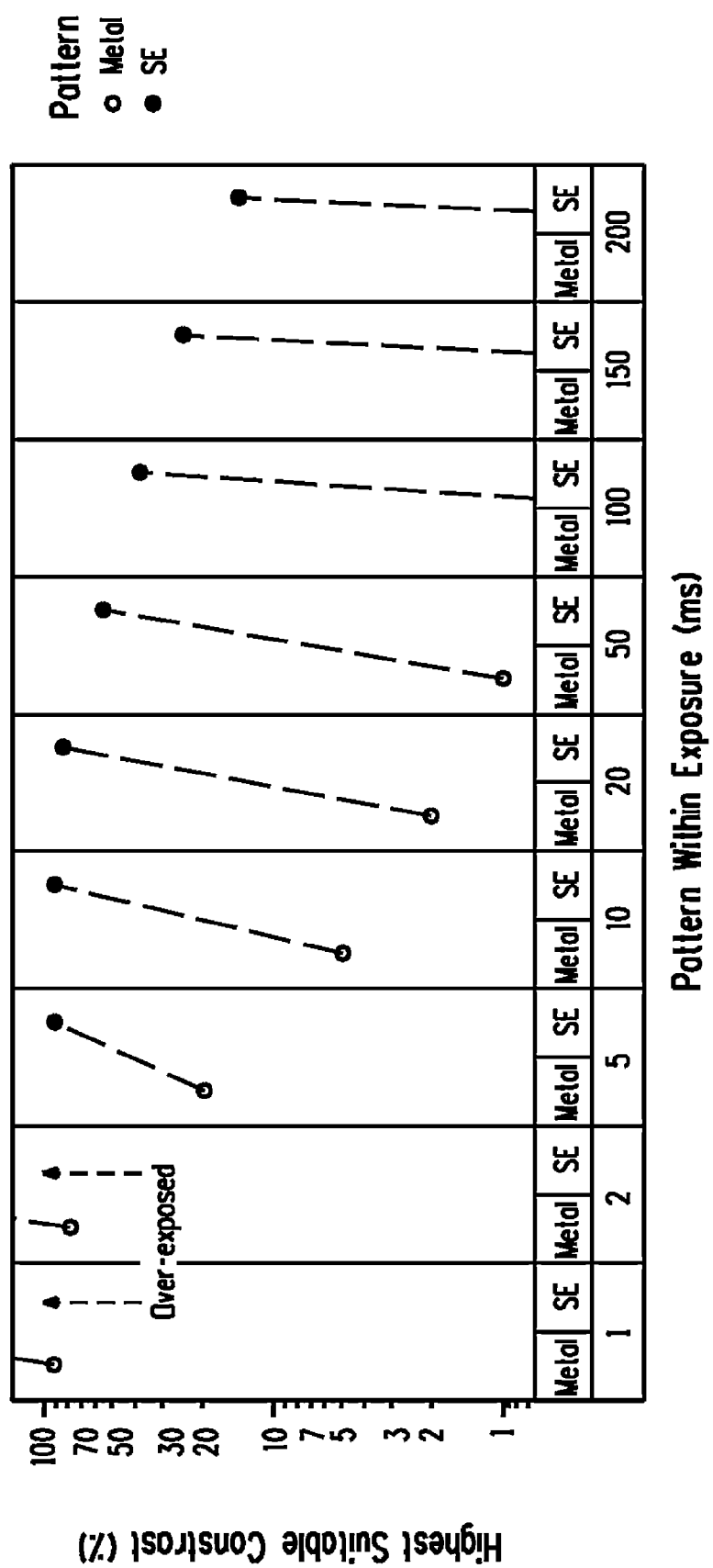
FIG. 2 shows highest contrast ratio that is suitable to illuminate two patterns with different optical properties, such as a selective emitter (SE) pattern (filled circles) and a metal pattern (open circles) at a given exposure time.

Other sets of contrast levels and exposure times are suitable as well, as illustrated in FIG. 1 and FIG. 2. But in all cases, the appropriate contrast levels at a given exposure time for the metal pattern are significantly lower than for the selective emitter pattern.

The following description is mostly directed to the photovoltaic cell with the selective emitter formed by printing silicon-nanoparticle ink onto the front side (the light-receiving side) of a silicon wafer. However, the scope of the present application is not limited to such embodiments. The present invention can be applied for other applications where two or more patterns are to be aligned with respect to each other and that have distinct optical properties (such as reflection properties). Both patterns can but do not have to have identical shape. One example is aligning a front metal electrode on the front surface with respect to a selectively doped front diffusion layer of selected polarity and forming ohmic contact to the front diffusion layer through the front anti-reflective layer. Another example is aligning a rear metal electrode on the rear surface with respect to a selectively doped rear diffusion layer of selected polarity and forming ohmic contact to the rear diffusion area through the rear passivation layer. Various references can be referred to. For example, as for the selective emitter technology on the front surface formed by using a silicon-containing nanoparticle ink in conjunction with a $POCl_3$ diffusion process, U.S. Publication US 2010/0136718, U.S. Publication US 2011/0003464, U.S. Publication US 2011/0003465, and U.S. Publication US 2011/0183504, C. B. Honsberg, Solar Energy Materials and Solar Cells 34, Issues 1-4, 1 Sep. 1994, Pages 117-123, S. Dauwe, et al. Prog. Photovolt: Res. Appl. 2002; 10:271-278, U.S. patent application Ser. No. 13/172040, U.S. patent application Ser. No. 13/099,794 and U.S. Provisional Patent application No. 61/577,901 are referred to.

For example, the following sequence can be used in an embodiment.
1. Define a number of sets of unique reference points in each pattern, which, in case of successful alignment of the two patterns, are at a known distance from each other.
2. Load the wafer with a selective emitter pattern into the field of view area of the vision system=position $P_0$.
3. Adjust the illumination conditions in the pattern recognition system to visualize the first pattern in an optimum manner.
4. Determine the coordinates of unique points in the selective emitter pattern by means of pattern recognition: e.g. the intersection of the centerline of a busbar and the centerline of the 3rd finger from the top of the pattern ($X_1/Y_1$; $X_2/Y_2$; $X_3/Y_3$).
5. Print the metal pattern, while the substrate is in a known location with respect to the location $P_0$, using a best guess of offset values.
6. Do not unload the wafer, but bring it back into the original position $P_0$, which was used for the initial pattern recognition of the selective emitter pattern.
7. Adjust the illumination conditions in the pattern recognition system to visualize the second pattern in an optimum manner.
8. Determine the coordinates of the corresponding unique points used above in the metal pattern by means of pattern recognition: e.g. the intersection of the centerline of a busbar and the centerline of the 3rd finger from the top of the pattern ($X_1'/Y_1'$; $X_2'/Y_2'$; $X_3'/Y_3'$).
9. Perform calculation of offset values: find unique coordinate transformation x, y, theta (translation/rotation) that minimizes distance between points $X_1/Y_1$ and $X_1'/Y_1'$, $X_2/Y_2$ and $X_2'/Y_2'$, $X_3/Y_3$ and $X_3'/Y_3'$, etc.
10. Use the calculated offset values x, y, theta to subsequently align the metal with respect to the selective emitter pattern. Multiple iterations can be performed to fine tune the process.
11. Repeat this process within certain time intervals during production to monitor/fine tune alignment to obtain stable and accurate alignment.

Figure 3:
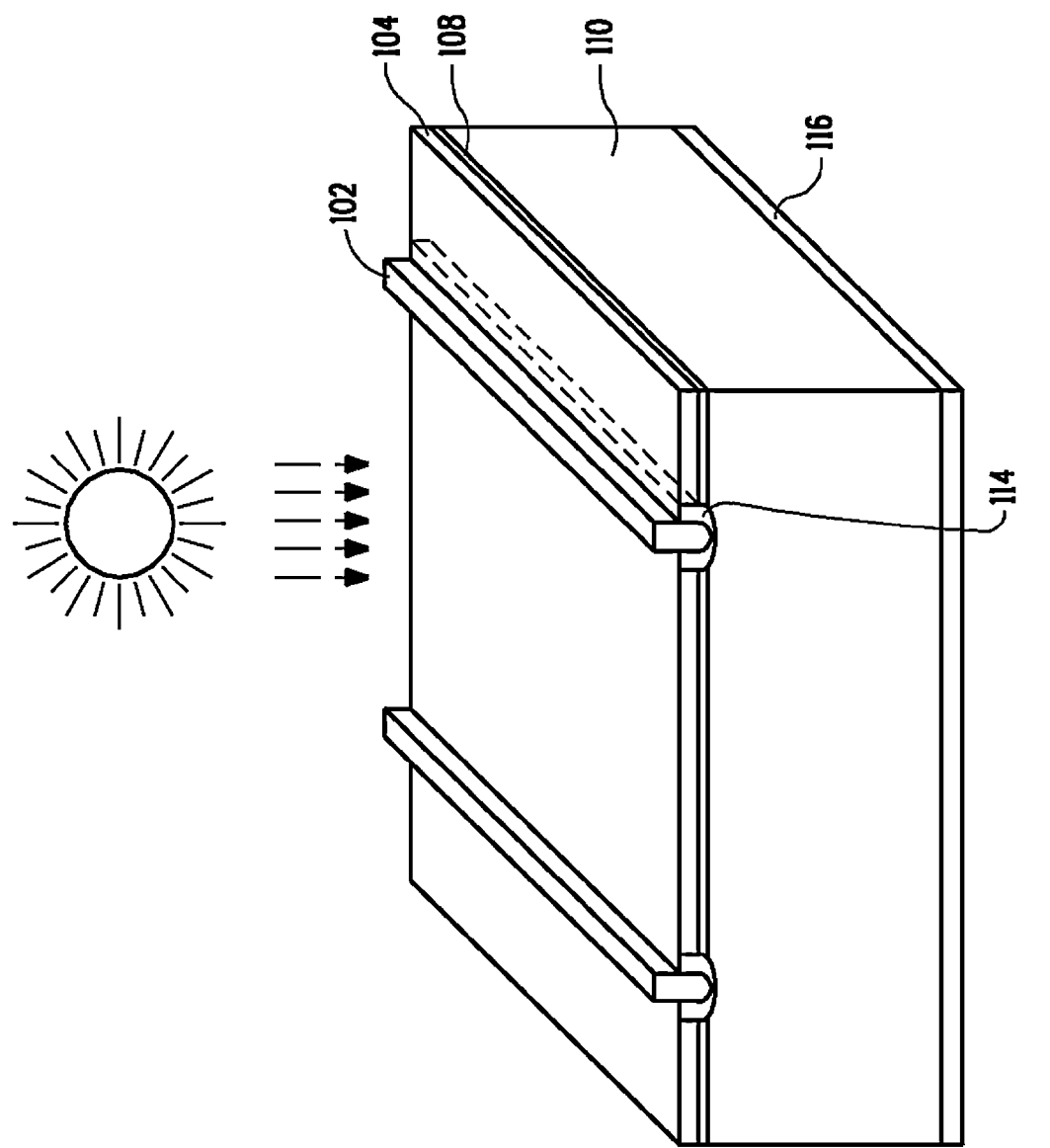
FIG. 3 shows a simplified diagram of a solar cell with a selective emitter (SE) and blanket BSF.

Referring now to FIG. 3, a simplified diagram of a solar cell with a selective emitter and blanket BSF. In a common configuration, an n++ diffused region 114 and n- diffused region 108 are first formed on a p- (lightly doped) silicon substrate 110. Silicon substrate 100 is boron-doped in an embodiment and phosphor-doped in another embodiment. Prior to the deposition of $SiN_x$ layer 104 on the front of the substrate, residual phosphosilicate glass (PSG) formed on the substrate surface during the phosphorous deposition process (i.e., $POCl_3$) is substantially removed, commonly by exposing the $SiO_2$ to HF.

The alignment process can be applied for other applications or other configurations. In am embodiment, the phosphorous-doped silicon wafer can be used instead of the boron-doped silicon wafer. In this configuration, an p++ diffused region is formed instead of the n++ diffused region 114. In another embodiment, the alignment process is applied for a rear metal electrode of photovoltaic cell on the rear surface with respect to a selectively doped rear diffusion layer of selected polarity and forming ohmic contact to the rear diffusion area through the rear passivation layer. In this configuration, the substrate can be a silicon wafer, the first pattern can be a selectively doped rear diffusion layer on the back side (the opposite side of the light-receiving side) of the solar cell, and the second pattern can be a rear metal contact of a photovoltaic cell.

Front-metal contact 102 and back surface field (BSF)/back metal contact 116 are formed on silicon substrate 110 in an embodiment. Front-metal contact 102 is generally formed from an Ag paste comprising Ag powder (about 70% to about 90%), glass frit (1 to 10 at %), and organic components (10 about to 30 about %). BSF/back metal contact 116 is generally configured to create an electrical field that repels and thus minimize the impact of minority carrier rear surface recombination. In addition, Ag pads [not shown] are generally applied onto BSF/back metal contract 116 in order to facilitate soldering for interconnection into modules.

A highly doped region (n++, 114) may be formed by depositing a silicon nanoparticle fluid comprising silicon nanoparticles in a set of organic solvents.

One method of depositing the layer of nanoparticles onto the silicon substrate surface is the deposition through the use of a colloidal dispersion (ink) or paste. Generally, colloidal dispersions of Group IV nanoparticles are possible because the interaction of the particle surface with the solvent is strong enough to overcome differences in density, which usually result in a material either sinking or floating in a liquid. That is, smaller nanoparticles disperse more easily than larger nanoparticles. In an embodiment, particle loadings may be around 3% wt. In contrast, if the particle loading substantially increases above about 10% wt, the colloidal dispersion thickens into a highly viscous ink or paste.

In general, the Group IV nanoparticles are transferred into the colloidal dispersion under a vacuum, or an inert substantially oxygen-free environment. In addition, particle dispersal methods and equipment such as sonication, high shear mixers, and high pressure/high shear homogenizers may be used to facilitate dispersion of the nanoparticles in a selected organic solvent or mixture of solvents. That is, mixtures that contain carbon molecules.

Once formulated, the colloidal dispersion may be applied to a substrate and subjected to a heat treatment in order to sinter the Group IV nanoparticles into a densified conductive film and consequently enable the diffusion of a dopant into the substrate. Examples of application methods include, but are not limited to, roll coating, slot die coating, gravure printing, flexographic drum printing, screen printing, and inkjet printing methods, etc.

The silicon substrates are diffused in an atmosphere of $POCl_3$, $N_2$, and $O_2$. The residual PSG glass layer is subsequently removed by an HF cleaning step. Any portion of the silicon nanoparticle film that is converted to a chemical composition substantially similar to PSG will also be removed.

In a next step, in order to minimize reflection and to optimize surface passivation, an anti-reflection coating and passivation layer of silicon nitride ($Si_3N_4$ and other non-stochiometric ratios of Si and N) is deposited on the silicon substrate in an ambient of silane, ammonia, nitrogen, and optionally hydrogen. Here, the reflective index of the $Si_3N_4$ layer is, in an embodiment, between about 1.90 and about 2.10, with a thickness of between 40 nm and about 120 nm.

Next, the location of the highly doped regions is determined based on their contrast with respect to lightly doped regions, and the metal contacts are deposited using a deposition device, such as a screen printer.

Figure 4:
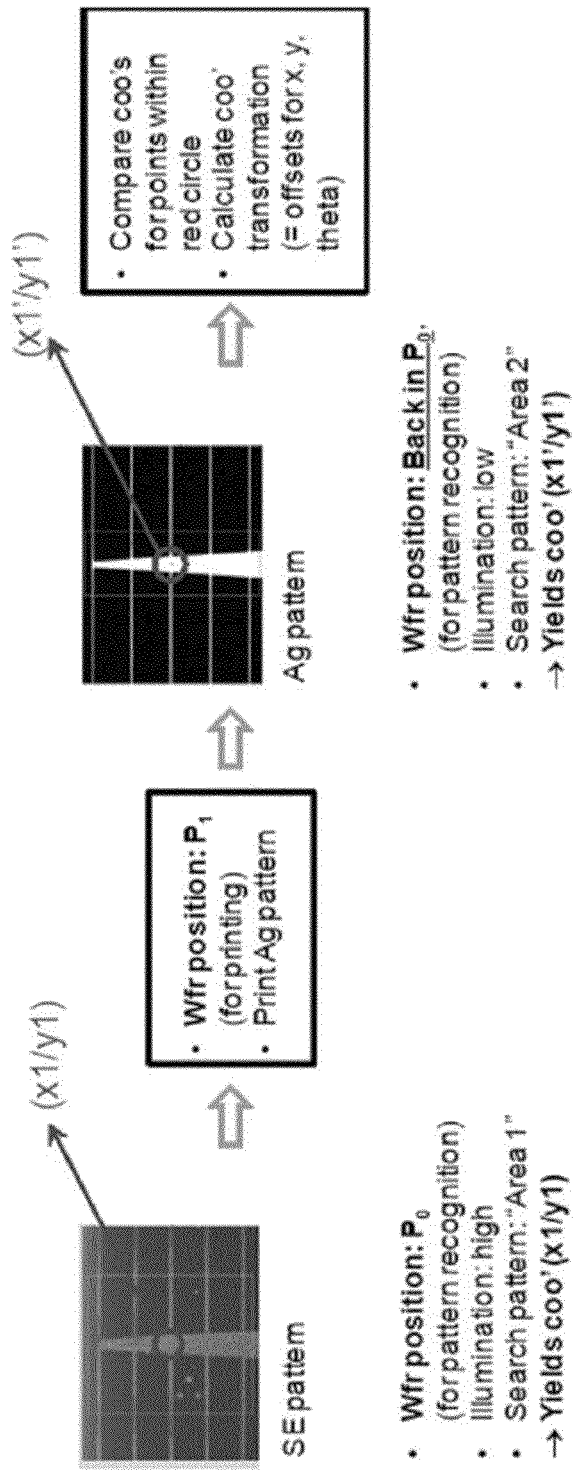
FIG. 4 shows a scheme of the process flow for the automatic determination of required offset parameters, following two consecutive pattern recognition events on consecutively printed patterns.

Referring to FIG. 4, first, a wafer with a selective emitter pattern is loaded into the field of view area of the vision system of the metal deposition system, at position $P_0$.

The illumination of the vision system is adjusted such that the grayscale contrast ratio of the first pattern with respect to the wafer background is increased, preferably maximized. Then, the coordinates of unique points $(X_1/Y_1; X_2/Y_2; X_3/Y_3; \ldots)$, in the first pattern are determined and recorded by means of pattern recognition: e.g. the intersection of a busbar centerline and the centerline through a finger bar, for example, the 3rd finger from the top of the pattern, as illustrated in the figure. The position of unique points in the pattern is not limited to the intersection of the busbar centerline and the finger contact. As long as the position can be uniquely recognized by the pattern recognition device, other positions can be used. The number of the positions, the coordinate of which are supposed to be determined, is not limited. The number needs to be larger than two, since at least two points are required to calculate the transformation consisting of rotation and translation. The number of the positions is chosen depending on the pattern type, the required accuracy of superimposing, etc. In an embodiment, two positions are used. In another embodiment, three or more (3, 4, 5, 6, 7, ...) positions are used for calculating the offset value.

Next, the metal pattern is printed on top of the first layer; however, at this point at an arbitrary, but known location with respect to the location $P_0$, using a best guess of offset values. At this step, the wafer is not unloaded, but brought back into its original position $P_0$. In an embodiment, the wafer is held in place by means of vacuum. The mechanical accuracy of production tools is high, such that the wafer can easily be brought back into the original position $P_0$. The illumination of the vision system is adjusted such that the grayscale contrast ratio of the second pattern with respect to the wafer background is increased, preferably maximized. Subsequently, the coordinates of the sets of unique points $(X_1'/Y_1'; X_2'/Y_2'; X_3'/Y_3'; \ldots)$ in the second pattern, which match the corresponding sets of points in the first pattern, are determined and recorded by means of pattern recognition: e.g. the intersection of a busbar centerline and the centerline through the 3rd finger from the top of the pattern, as illustrated in the figure.

At this point, the calculation of offset values for the alignment procedure is done by determining the unique coordinate translation/rotation, which minimizes the distance between the sets of points $X_1/Y_1$ and $X_1'/Y_1'$, $X_2/Y_2$ and $X_2'/Y_2'$, ... A unique set of translation parameters x and y, as well as a rotational angle theta is the result of this calculation, and the parameters are used as offset values to subsequently align the second pattern with respect to the first pattern on consecutive wafers. Multiple (2, 3, 4 or more) iterations of this procedure can be performed to fine tune this process. Furthermore, this process can be repeated within certain time intervals during production to monitor/fine tune the alignment accuracy.

Figure 5:
FIG. 5 shows an example of the determination of coordinates of unique points $(X_1/Y_1; X_2/Y_2; X_3/Y_3; \ldots)$, which are contained in the first pattern.
Figure 5:
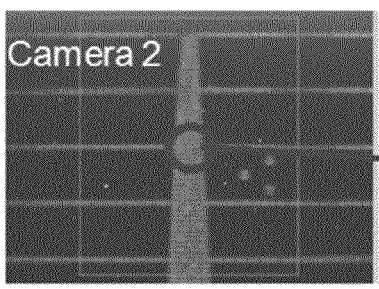
Figure 6:
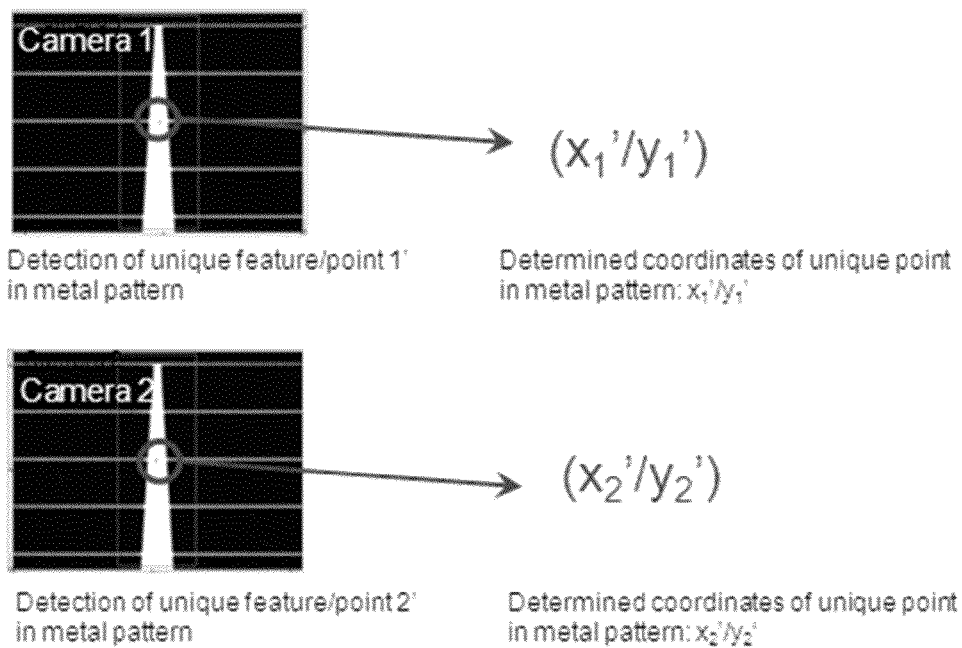
FIG. 6 shows an example of the determination of coordinates of unique points $(X_1'/Y_1'; X_2'/Y_2'; X_3'/Y_3'; \ldots)$, which are contained in the second pattern.

Below is an example of the sequence, referring to FIG. 5 and FIG. 6. FIG. 5 shows an example of the determination of coordinates of unique points $(X_1/Y_1; X_2/Y_2; X_3/Y_3; \ldots)$, which are contained in the first pattern. The illumination of the vision system is adjusted such that the grayscale contrast ratio of the first pattern with respect to the wafer background is increased, preferably maximized. Here, the unique points are defined by the intersection of a busbar centerline and the centerline through the 3rd finger from the top of the pattern. Additional fiducial marks are used in the first pattern to enhance the stability of the pattern recognition process. FIG. 6 shows an example of the determination of coordinates of unique points $(X_1'/Y_1'; X_2'/Y_2'; X_3'/Y_3'; \ldots)$, which are contained in the second pattern. The illumination of the vision system is adjusted such that the grayscale contrast ratio of the second pattern with respect to the wafer background is increased, preferably maximized. Here, the unique points are defined by the intersection of a busbar centerline and the centerline through the 3rd finger from the top of the pattern. The unique sets of points in the first pattern (FIG. 5) and second pattern (FIG. 6) are defined such that they perfectly overlay if and only if, the two patterns are perfectly well aligned in an embodiment.

Figure 7:
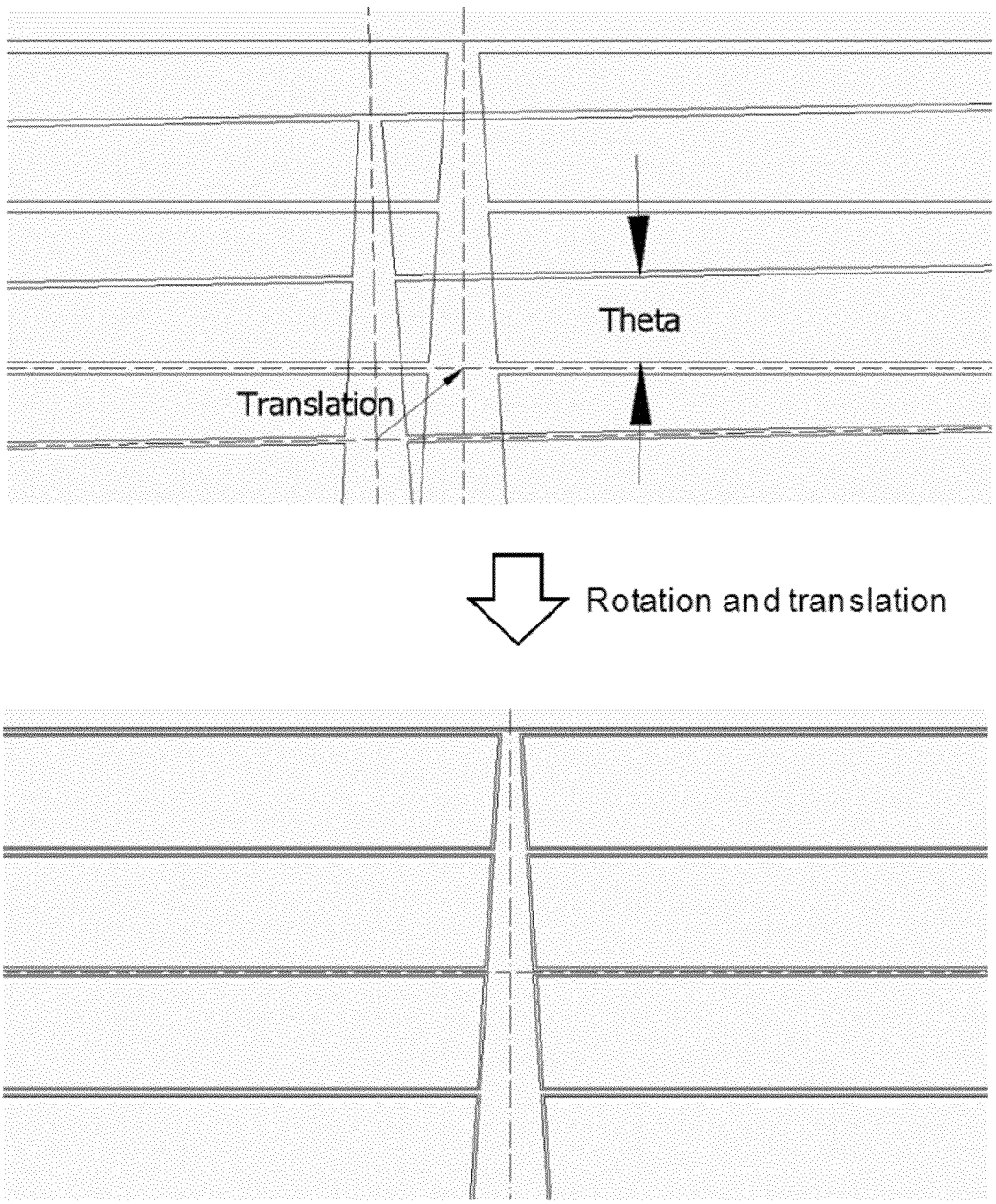
FIG. 7 shows a sketch of SE and metal patterns before (top) and after (bottom) correction of offset values for metal pattern deposition process.

FIG. 7 shows a sketch of SE and metal patterns before (top) and after (bottom) correction of offset values for metal pattern deposition process. Unique and corresponding points, which are present in both patterns, can be used to determine required rotation and translation parameters.

Figure 8:
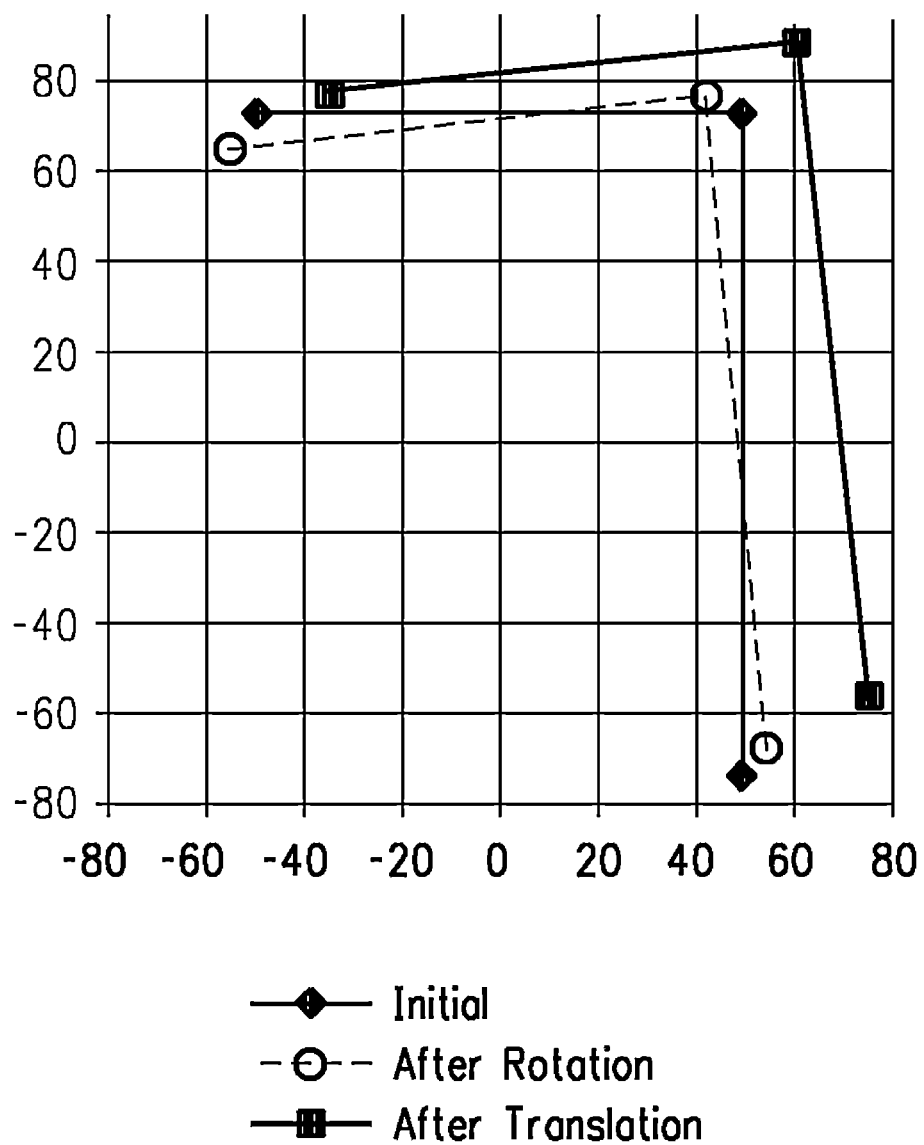
FIG. 8 shows a sketch of two identical patterns of identical shapes (diamond and square symbols) that are offset from each other.

FIG. 8 shows a sketch of two identical patterns of identical shapes (diamond and square symbols) that are offset from each other. There is only one linear transformation with corresponding rotation and translation parameters theta, x, and y, that describes the offset between the two patterns.

This method has several advantages over the manual method. There is no need for a calibrated microscope with accurate measurement function, which can be expensive and is not commonly available in production environments. There is no need to produce illumination conditions for the microscope that allows for simultaneous visualization of both patterns in one measurement step, which can be difficult to achieve. Furthermore, the contrast between the second and first pattern does not need to be sufficient to allow that protruding areas of the underlying pattern can easily be distinguished from the top pattern. Also, this method is much less sensitive to potential production-related variations in the grayscale contrast ratio of the first pattern, since the illumination can be optimized for that respective pattern and there is no masking by an overlying pattern.

Furthermore, since the pattern recognition is done first on the selective emitter and then on the metal pattern, selective emitter patterns of significantly lower contrast can be used, which may improve cell performance [D. Poplayskyy, G. Scardera, M. Abbott, A. Meisel, X. Chen, S. Shah, E. Tai, M. Terry, F. Lemmi. "Silicon Ink Selective Emitter Process: Optimization Of The Short Wavelength Response". 25th European Photovoltaic Solar Energy Conference and Exhibition, 2010, Valencia, Spain.].

Since the determination of the coordinate positions in both patterns, and therefore of the offset between both patterns, is done using pattern recognition software, there is significantly better process control and stability: the process becomes faster, more accurate, more repeatable, and there is no operator skill required.

This method allows to significantly reduce the problem of misalignment between two layers, which is not uncommon in production environments.

Figure 9:
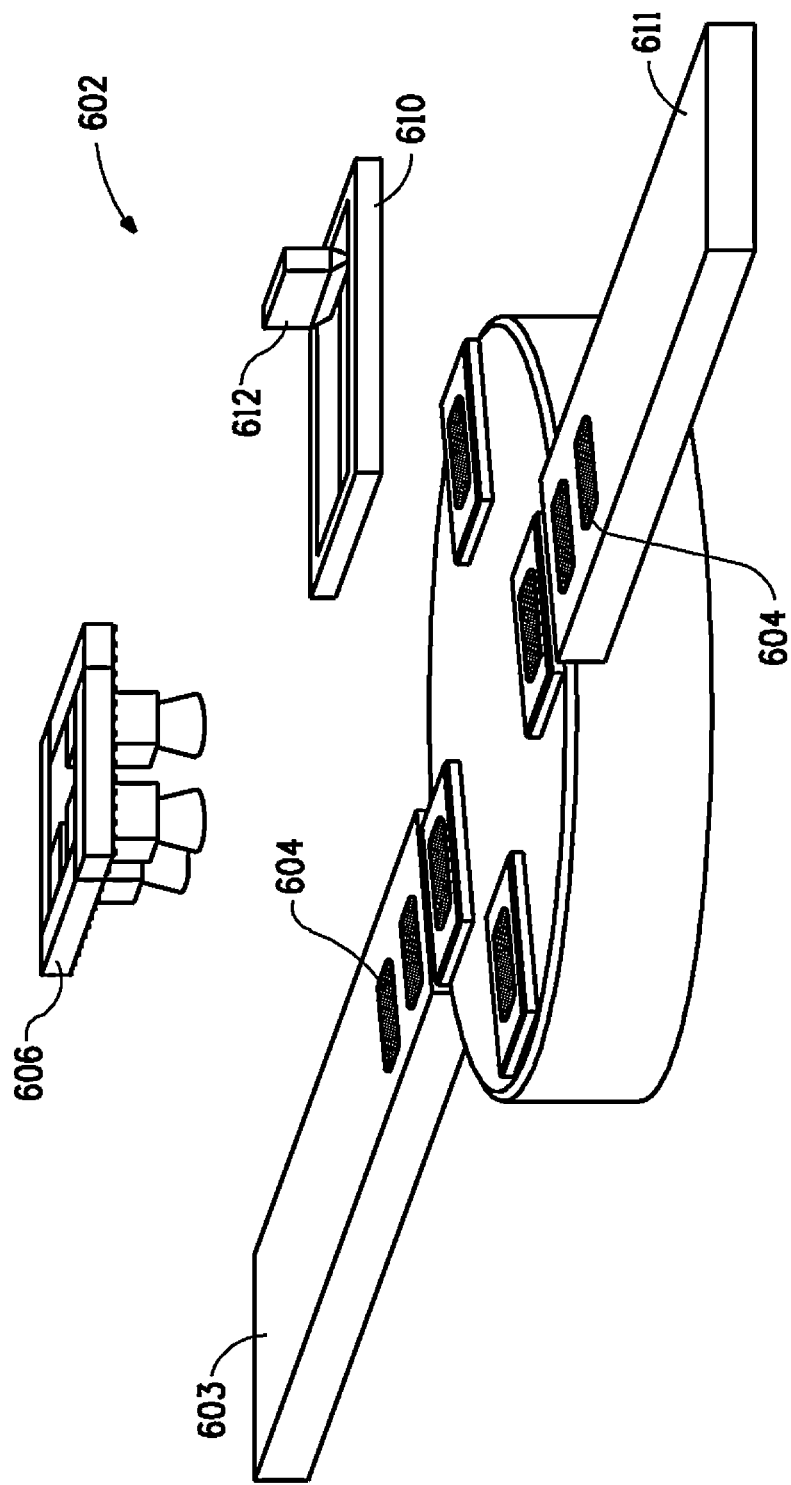
FIG. 9 shows a simplified diagram of an apparatus for superimposing a set of metal contacts on a set of highly doped regions on a crystalline solar cell substrate.

FIG. 9 shows a simplified diagram of an apparatus (602) for superimposing a set of metal contacts on a set of highly doped regions on a crystalline solar cell substrate.

Initially, a solar cell substrate 604 with a set of highly doped regions, such as for a selective emitter or a back-contact solar cell, is positioned on a substrate intake transport apparatus 603 (e.g., conveyor belt, etc.). Solar cell substrate 604 is then positioned in pattern detection apparatus 606 in order to determine the axial (x and y) and angular position (theta) of known landmarks within the pattern of the highly doped regions. For example, if the set of highly doped regions is patterned as a set of busbars and fingers, the set of unique landmarks may be specific intersections of a busbar to a finger at well defined locations. Additional landmarks can be added to the pattern of highly doped regions. These landmarks may be used as unique features within the patterns of highly doped regions for the image recognition step.

Once determined, the locations of the landmarks within the set of highly doped regions are transmitted to metal deposition apparatus 610 (such as a screen printer), which includes squeegee 612. After solar cell substrate 604 is positioned in metal deposition apparatus 610 (here via turntable 608), the printing screen of metal deposition apparatus 610 is adjusted axially and angularly in order to align the set of metal contacts to be deposited onto the set of highly doped regions. After deposition of the metal contacts onto the set of highly doped regions using squeegee 612, the solar cell substrate with the set of metal contacts [not shown] is then positioned on substrate outtake transport apparatus 611, where it may be transported for additional processing.

In one configuration, wafer 604 is placed in the pattern detection apparatus 606 of an Applied Materials Baccini screen printer tool with a vision system based on 3 high-resolution cameras and image recognition software. Initially, the image recognition software is instructed to look for a specific set of patterns or landmarks. Here, the image recognition software vision libraries are based on Cognex Vision Pro and may include several algorithms such as 'Pattern Matching', 'PatMax', and 'PatCAD'. The first two algorithms record an image of a model pattern of best possible quality and process it into characteristic geometric features (i.e. lines, circles) that are used for image recognition, whereas the last algorithm allows loading a design generated with CAD software, which represents the model pattern in an ideal case.

In general, in order to be identified, the set of patterns is chosen such that it is located within the field of view of each camera used for the vision system. Pattern recognition generally requires the availability of unique features within the pattern, which define distinct locations in x and y direction. These features can either be contained in the first pattern itself, or may be added as unique alignment features without impacting the device performance. Next, the solar cell substrate is illuminated at a wavelength between about 375 nm and about 600 nm in an embodiment, between 700 nm and 800 nm in another embodiment, and around at 470 nm or 540 nm in another embodiment.

In general, the diffuse light sensors are selected such that they are sensitive to the wavelengths of the appropriate illumination source. In this configuration, video cameras are used with appropriate CCD chips. The resolution needs to be sufficient to resolve all relevant features of the pattern used for the alignment. The field of view needs to be large enough to image all relevant features of the pattern used for the alignment. Band pass filters optimized to the wavelength range of the illumination source may be used to filter out background light and obtain better contrast. For example, SONY XCD-SX90 CCD cameras together with Tamron lenses CCTV 21HA (focal length was 50 mm) can be used. The resolution is 1280×960 pixels in an embodiment. The field of view at approximately 155 mm operating distance is about 20 mm×15 mm in an embodiment. Typically, the requirements for the placement accuracy of the wafer containing the pattern are that the areas of interest are within the field of view of the cameras. This corresponds to an area of 20 mm×15 mm in an embodiment. The sizes of the features that are used for image recognition are 5 mm×5 mm in an embodiment. In this case, the wafer can be placed within +/− 7.5 mm in both directions.

The detection of the pattern with the vision tool is described next. The vision system software has several parameters that need to be adjusted in order to successfully detect the model pattern of interest in the recorded image. Exposure, brightness, contrast may be adjusted in order to obtain maximum contrast. In general, the values depend on the given illumination source and position, camera type and position, wafer surface, and pattern composition, etc. The three values may be adjusted such that the gray scale contrast ratio is large enough to allow for pattern recognition. In this configuration, successful pattern recognition requires this ratio to be larger than 1.3 in an embodiment. Values as low as 1.1 may be sufficient to allow for successful pattern recognition.

In general, the vision software searches for a match of the model pattern to the detected image.

In the next step, the screen translation/rotation and alignment of screen with respect to the previously deposited pattern is calculated. For pattern alignment, at least two coordinates are defined for a calculation of screen translation and rotation in an embodiment. The use of three coordinates leads to an over-constrained system and improves the accuracy of the alignment process.

In this configuration, the alignment was based on three coordinates, but two coordinates are generally sufficient. The coordinates used for the pattern alignment calculations are defined as the geometric center of the model pattern, either determined by a model image, or by a CAD drawing.

EXAMPLE

A set of crystalline silicon substrates was first pre-cleaned in a sulfuric acid solution and then textured by treating the substrates in a solution of $H_2O$, IPA, and KOH. After cleaning and rinsing steps in SC-2 (a mixture of $H_2O$, HCl (hydrochloric acid) and $H_2O_2$ (hydrogen peroxide)), piranha (a mixture of sulfuric acid ($H_2SO_4$) and $H_2O_2$), HF, and $H_2O$, respectively, a silicon nanoparticle fluid comprising 4 wt % silicon nanoparticle in a set of organic solvents, was deposited on each textured crystalline silicon substrate, forming the building block of the selective emitter pattern of highly doped regions. After baking at a temperature of 200° C. in an inert atmosphere for a time period of 2 minutes in order to densify the film, the crystalline silicon substrates were exposed to a dopant source in a diffusion furnace with an atmosphere of $POCl_3$, $N_2$, and $O_2$, at a first temperature of 800° C. for 15 minutes and a second temperature at 885° C. for 25 minutes. Next, the substrates were subjected to an HF cleaning step in a RENA InOx inline PSG removal tool. Etchant exposure results in a thinner densified silicon nanoparticle film and a partial removal of the PSG glass layer. An anti-reflection coating and passivation layer of silicon nitride ($Si_3N_4$ and other non-stochiometric ratios of Si and N) was deposited on the silicon substrate in an ambient of silane, ammonia, nitrogen, and optionally hydrogen using a Roth&Rau SiNA inline PECVD Silicon Nitride deposition tool. Here, the reflective index of the $Si_3N_4$ layer is, in an embodiment, between about 1.90 and about 2.10, with a thickness of between 40 nm and about 120 nm. In a next step, a sample with the first pattern was inspected with an optical vision tool (such as an optical microscope or Micro-Vu Vertex 320 tool as described below), and the respective coordinates of the landmark features as discussed above were determined on the real pattern. These coordinates may be entered as nominal positions into the software that compares these nominal locations with the ones determined in the image recognition process and calculates a translation and rotation for the screen to guarantee alignment of the two patterns. A test sample was printed and inspected using the same vision tool. The remaining offsets in x-, y-, and theta-direction, which will be calculated below, depend on mechanical parameters (screen location, squeegee location, etc.) and can be corrected for in the software.

Below tables show examples of coordinates of reference points in both patterns and offset values for the calculated coordinate transformation. For the values of $X_1/Y_1$ and $X_1'/Y_1'$, $X_2/Y_2$ and $X_2'/Y_2'$, $X_3/Y_3$ and $X_3'/Y_3'$ assumed here, the unique set of translation parameters x and y, as well as a rotational angle theta was calculated using a software for coordinate transformation (Java Graticule 3D).

TABLE 1

| Assumed coordinates determined in pattern matching in software | | | |
|---|---|---|---|
| Print Pattern | Point | X-value | Y-value |
| SE pattern | $X_1/Y_1$ | −48.496 | 72.643 |
| SE pattern | $X_2/Y_2$ | 48.552 | 72.614 |
| SE pattern | $X_3/Y_3$ | 48.492 | −72.605 |
| Metal pattern | $X_1'/Y_1'$ | −49.065 | 72.454 |
| Metal pattern | $X_2'/Y_2'$ | 47.915 | 73.315 |
| Metal pattern | $X_3'/Y_3'$ | 49.397 | −71.948 |

TABLE 2

| Calculated transformation R, Tx, Ty for this set of coordinates (best fit) | | |
|---|---|---|
| | Transformation parameter | Standard deviation $\sigma_{par}$ |
| R (rad) | 0.0099368454 | 0.0004598831 |
| Tx (mm) | 0.1411055434 | 0.0394888886 |
| Ty (mm) | 0.2301269331 | 0.0385673582 |

TABLE 3

| Resulting offset values | |
|---|---|
| Resulting offset values: | |
| x-offset (mm) | 0.141 |
| y-offset (mm) | 0.230 |
| theta offset (deg) | 0.569 |

In the case described here, the metal pattern of subsequent samples would be perfectly aligned with respect to the first pattern, if prior to the deposition of the metal pattern, offset values of 141 μm in x-direction, 230 μm in y-direction, and 569 mdegrees in angular direction were applied.

Once the offset values have been determined, the location of the known landmarks within the set of highly doped regions can be transmitted to metal deposition apparatus (610, in FIG. 9), which includes squeegee 612 as previously described. After adjusting the setup and parameters for the image recognition and pattern alignment process, a layer of silver containing glass frit to fire through the $Si_3N_4$ layer can be printed on top of the previously deposited layer defining the highly doped region.

Once the above calculated offset values are entered, all successive samples can be printed within the achievable accuracy of the vision system.

For the purposes of this disclosure and unless otherwise specified, "a" or "an" means "one or more." All patents, applications, references and publications cited herein are incorporated by reference in their entirety to the same extent as if they were individually incorporated by reference.

The invention has been described with reference to various specific and illustrative embodiments. However, it should be understood that many variations and modifications may be made while remaining within the spirit and scope of the invention.

What is claimed is:
1. A method for calculating an offset value for aligned deposition of a second pattern onto a first pattern, comprising steps of:
   (a) loading a substrate with the first pattern on a surface of the substrate into a pattern recognition device at an original position inside the pattern recognition device;

(b) determining a coordinate of a prescribed point of the first pattern by the pattern recognition device by use of illumination;
(c) superimposing the second pattern onto the first pattern on the surface of the substrate;
(d) bringing back the substrate with the first pattern and the second pattern into the original position inside the pattern recognition device;
(e) determining a coordinate of a prescribed point of the second pattern by the pattern recognition device by use of illumination; wherein the prescribed point of the first pattern corresponds to the prescribed point of the second pattern; and
(f) calculating the offset value between the first pattern and the second pattern,
wherein an illumination for determining the prescribed point of the first pattern has a different spectrum or illumination intensity from an illumination for determining the prescribed point of the second pattern, and
wherein the prescribed point is an intersection of a busbar and a finger contact on a silicon wafer.

2. A method of claim 1, wherein the substrate is a boron-doped silicon wafer, wherein the surface of the substrate is a light-receiving side of a photovoltaic cell, wherein the first pattern is a selective emitter pattern where phosphor is heavily doped into the boron-doped silicon wafer, and wherein the second pattern is a front metal contact of the photovoltaic cell.

3. A method of claim 1, wherein the substrate is a phosphorous-doped silicon wafer, wherein the surface of the substrate is a light-receiving side of a photovoltaic cell, wherein the first pattern is a selective emitter pattern where boron is heavily doped into the phosphorous-doped silicon wafer, and wherein the second pattern is a front metal contact of the photovoltaic cell.

4. A method of claim 1, wherein the substrate is a silicon wafer, wherein the surface of the substrate is a back side of a photovoltaic cell, wherein the first pattern is a selectively doped rear diffusion layer on the back side of the photovoltaic cell, and wherein the second pattern is a rear metal contact of the photovoltaic cell.

5. A method of claim 1, wherein two or more of the prescribed points are used for calculating the offset value.

6. A method of claim 1, wherein the step (a) through the step (f) are repeated, and wherein a superimposing position of the second pattern at the step (c) is determined with reference to the offset value calculated in a previous sequence.

7. A method for producing a superimposed pattern, comprising steps of:
loading a substrate with a first pattern on a surface of the substrate into a deposition device of a second pattern; and
superimposing the second pattern onto the first pattern on the surface of the substrate based on the offset value calculated by the method of claim 1.

8. A method of claim 7, wherein the substrate is a boron-doped silicon wafer, wherein the surface of the substrate is a light-receiving side of a photovoltaic cell, wherein the first pattern is a selective emitter pattern where phosphor is heavily doped into the boron-doped silicon wafer, and wherein the second pattern is a front metal contact of the photovoltaic cell.

9. A method of claim 7, wherein the substrate is a phosphorous-doped silicon wafer, wherein the surface of the substrate is a light-receiving side of a photovoltaic cell, wherein the first pattern is a selective emitter pattern where boron is heavily doped into the phosphorous-doped silicon wafer, and wherein the second pattern is a front metal contact of the photovoltaic cell.

10. A method of claim 7, wherein the substrate is a silicon wafer, wherein the surface of the substrate is a back side of a photovoltaic cell, wherein the first pattern is a selectively doped rear diffusion layer on the back side of the solar cell, and wherein the second pattern is a rear metal contact of the photovoltaic cell.

11. A method of claim 7, wherein the method is implemented in a manufacturing facility and wherein the offset value is recalculated at a prescribed time interval for calibration.

* * * * *